(12) United States Patent
Rofougaran et al.

(10) Patent No.: US 9,935,663 B1
(45) Date of Patent: Apr. 3, 2018

(54) LOW-LOSS ISOLATING OUTPHASING POWER COMBINER IN A RADIO FREQUENCY DEVICE

(71) Applicant: MOVANDI CORPORATION, Newport Beach, CA (US)

(72) Inventors: Ahmadreza Rofougaran, Newport Beach, CA (US); Sam Gharavi, Irvine, CA (US); Farid Shirinfar, Granada Hills, CA (US); Kartik Sridharan, San Diego, CA (US); Michael Boers, South Turramurra (AU); Seunghwan Yoon, Irvine, CA (US); Donghyup Shin, Irvine, CA (US); Stephen Wu, Fountain Valley, CA (US); Maryam Rofougaran, Rancho Palos Verdes, CA (US)

(73) Assignee: Movandi Corporation, Newport Beach, CA (US)

(*) Notice: Subject to any disclaimer, the term of this patent is extended or adjusted under 35 U.S.C. 154(b) by 0 days.

(21) Appl. No.: 15/655,255

(22) Filed: Jul. 20, 2017

(51) Int. Cl.
*H04B 1/02* (2006.01)
*H04B 1/04* (2006.01)
(Continued)

(52) U.S. Cl.
CPC ......... *H04B 1/0458* (2013.01); *H03F 3/2176* (2013.01); *H03F 3/24* (2013.01);
(Continued)

(58) Field of Classification Search
CPC ....... H04B 1/0458; H03F 3/2176; H03F 3/24; H03F 2200/537; H03F 2200/72; H03F 2203/72
(Continued)

(56) References Cited

U.S. PATENT DOCUMENTS 7,729,445 B2 * 6/2010 Ravi ............... H03F 1/0294
375/297
8,290,086 B2 * 10/2012 Bose ............... H03F 1/0294
375/298
(Continued)

OTHER PUBLICATIONS

Moloudi, et al., The Outphasing RF Power Amplifier: A Comprehensive Analysis and a Class-B CMOS Realization, IEEE Journal of Solid-State Circuits, pp. 1357-1369, vol. 48, No. 6, Jun. 2013.
(Continued)

*Primary Examiner* — Sonny Trinh

(74) *Attorney, Agent, or Firm* — Chip Law Group

(57) ABSTRACT

The power combiner circuit includes a transformer having a first primary coil coupled to a first power amplifier (PA), a second primary coil coupled to a second PA, and a secondary coil. The secondary coil supplies a current to an antenna based on a first direction of a first phase of a first amplified constant-envelope signal in the first primary coil with respect to a second phase of a second amplified constant-envelope signal in the second primary coil. A first load impedance is associated with the first PA and a second load impedance is associated with the second PA. The first load impedance and the second load impedance receive currents from the first PA and second PA, respectively, based on a second direction of the first phase of the first amplified constant-envelope signal with respect to the second phase of the second amplified constant-envelope signal.

21 Claims, 5 Drawing Sheets

(51) Int. Cl.
*H03F 3/24* (2006.01)
*H03F 3/217* (2006.01)

(52) U.S. Cl.
CPC .... *H03F 2200/537* (2013.01); *H03F 2203/72* (2013.01); *H04B 2001/045* (2013.01)

(58) Field of Classification Search
USPC ................ 455/91, 115.1; 375/295, 296, 297
See application file for complete search history.

(56) References Cited

U.S. PATENT DOCUMENTS

| | | | |
|---|---|---|---|
| 9,197,465 B2 * | 11/2015 | Ma | H04L 25/4902 |
| 9,742,367 B2 * | 8/2017 | Mirzaei | H03F 1/0294 |
| 2010/0074367 A1 * | 3/2010 | Kim | H03F 1/0294 |
| | | | 375/296 |

OTHER PUBLICATIONS

Zhao, et al., A 60-GHz Outphasing Transmitter in 40-nm CMOS, IEEE Journal of Solid-State Circuits, pp. 3172-3183, vol. 47, No. 12, Dec. 2012.

* cited by examiner

LOW-LOSS ISOLATING OUTPHASING POWER COMBINER IN A RADIO FREQUENCY DEVICE

CROSS-REFERENCE TO RELATED APPLICATIONS/INCORPORATION BY REFERENCE

This Application makes reference to:
Application Ser. No. 15/432,018, which was filed on Feb. 14, 2017, entitled "Outphasing Transmit and Receive Wireless Systems Having Dual-Polarized Antennas."

The above referenced Application is hereby incorporated herein by reference in its entirety.

FIELD OF TECHNOLOGY

Certain embodiments of the disclosure relate to outphasing wireless systems. More specifically, certain embodiments of the disclosure relate to a low-loss isolating outphasing power combiner in a radio frequency (RF) transmitter.

BACKGROUND

Currently, there is a huge demand for high data-rate and bandwidth-efficient wireless transmission standards (such as 802.11 Wireless LAN, cellular LTE, and 5G) due to extensive use of wireless communication in various fields of applications, such as in homes, public places, or office areas. Accordingly, various concepts, such as linear amplification using nonlinear components (LINC) (also known as outphasing), are being used for highly efficient linear power amplification of wireless signals, for example RF signals.

Typically, in an outphasing transmit wireless system, an RF signal with varying amplitude (also referred to as "variable-envelope signal") may be decomposed into two (or more) components with constant amplitude and different phases (also referred to as "constant-envelope signals"). Such constant envelope signals may be amplified by power amplifiers in an RF transmitter.

In certain scenarios, the RF transmitter may further include a power combiner that may combine the two amplified constant-envelope signals. The combined signal may be then transmitted by the RF transmitter, via a multi-antenna array, to an RF receiver. In certain instances, when the power combiner is an isolating power combiner, such as a Wilkinson combiner, a certain amount of power may be lost in a resistor within the power combiner due to the different phases of the two outphasing constant-envelope signals. Alternatively, when the power combiner is a non-isolating (low-loss) power combiner, the power amplifiers that feed the power combiner may interfere with each other. Such interference may reduce the linearity of the power amplifiers and hence, may increase the error vector magnitude (EVM) of the RF signal. Thus, there is required a low-loss isolating outphasing power combiner that overcomes these deficiencies.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY OF THE DISCLOSURE

A system is provided for a low-loss isolating outphasing power combiner in an RF device, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE DISCLOSURE

Certain embodiments of the disclosure may be found in a system for a low-loss isolating outphasing power combiner in an RF device. In the following description, reference is made to the accompanying drawings, which form a part hereof, and in which is shown, by way of illustration, various embodiments of the present disclosure.

Figure 1:
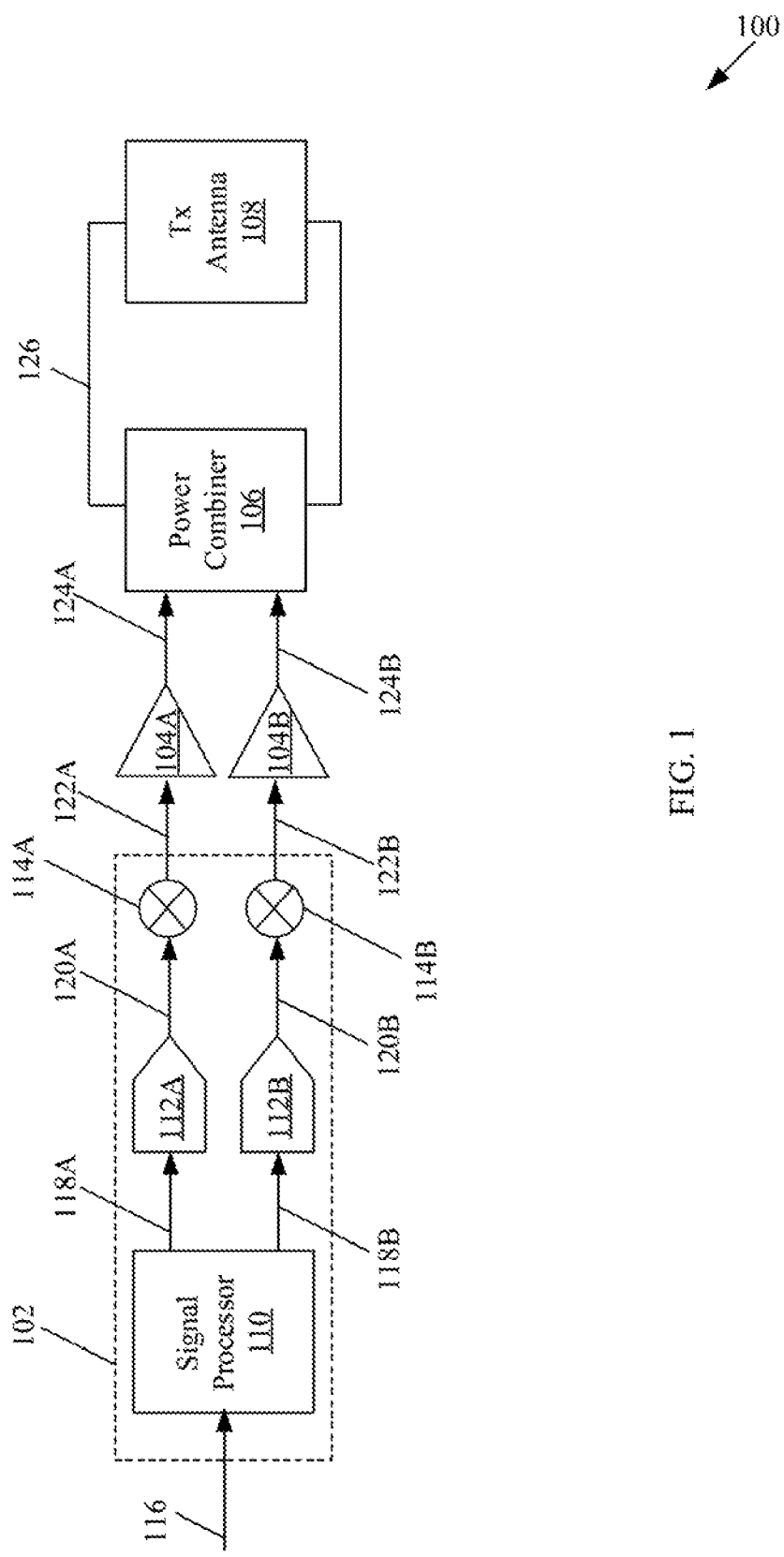
FIG. 1 illustrates an exemplary wireless system diagram of a portion of an exemplary outphasing RF transmitter, in accordance with an exemplary embodiment of the disclosure.

FIG. 1 illustrates an exemplary wireless system diagram of a portion of an exemplary outphasing RF transmitter (Tx), in accordance with an exemplary embodiment of the disclosure. With reference to FIG. 1, there is shown an outphasing RF Tx 100 that includes a signal decomposition block 102, a first power amplifier (PA) 104A, a second PA 104B, a power combiner 106, and a Tx antenna 108. The signal decomposition block 102 may further include a signal processor 110, a first digital-to-analog converter (DAC) 112A, a second DAC 112B, a first mixer 114A, and a second mixer 114B. The signal decomposition block 102 may be coupled to the first PA 104A and the second PA 104B. The first PA 104A and the second PA 104B may be further coupled to the power combiner 106. The power combiner 106 may be further coupled to the Tx antenna 108. In the signal decomposition block 102, the signal processor 110 is coupled to the first DAC 112A and the second DAC 112B. Further, the first DAC 112A and the second DAC 112B are coupled to the first mixer 114A and the second mixer 114B, respectively. It may be noted that the signal decomposition block 102 may further include additional signal conditioning circuitry, such as phase shifters and time delays in a phased array, without deviation in the scope of the disclosure.

With reference to FIG. 1, a modulated input signal 116 may be provided to the signal decomposition block 102. The modulated input signal 116 is an amplitude and phase modulated signal that may be provided by, for example a modem (not shown). The modulated input signal 116 is a variable amplitude signal, expressed in equation (1) below:

$$S_{in}(t)=A_M*\sin(\omega t+\varphi(t)) \quad (1)$$

where, $S_{in}(t)$ represents the modulated input signal 116,
$A_M$ is the peak value of A(t) that represents the time-varying amplitude, and
φ(t) represents outphasing angle.

The signal processor 110 in the signal decomposition block 102 may be configured to decompose the modulated input signal 116 (with variable amplitude) into two constant amplitude digital signals 118A and 118B. The two constant amplitude digital signals 118A and 118B may have a single constant amplitude level. The signal processor 110 may be implemented, for example, using a field-programmable gate array (FPGA) or an application-specific integrated circuit (ASIC) chip. The signal processor 110 may feed the two constant amplitude digital signals 118A and 118B to the first DAC 112A and the second DAC 112B, respectively.

The first DAC 112A and the second DAC 112B may be configured to convert the two constant amplitude digital signals 118A and 118B into two constant amplitude analog signals 120A and 120B. The first DAC 112A and the second DAC 112B may feed the two constant amplitude analog signals 120A and 120B to the first mixer 114A and the second mixer 114B, respectively.

The first mixer 114A and the second mixer 114B may be configured to upconvert the two constant amplitude analog signals 120A and 120B into two constant amplitude RF signals, hereinafter referred to as constant-envelope signals 122A and 122B. The two constant-envelope signals 122A and 122B are expressed in equations (2) and (3) below:

$$S_1(t)=A_M/2*\sin(\omega t+\varphi(t)+\psi(t)) \quad (2)$$

$$S_2(t)=A_M/2*\sin(\omega t+\varphi(t)-\psi(t)) \quad (3)$$

where $S_1(t)$ and $S_2(t)$ represent the constant-envelope signals 122A and 122B,
$A_M$ is the peak value of A(t) that represents the time-varying amplitude, and
ψ(t) represents arc cos(A(t)). The first mixer 114A and the second mixer 114B may feed the constant-envelope signals 122A and 122B to the first PA 104A and the second PA 104B, respectively.

The first PA 104A and the second PA 104B, with similar impedances, may be configured to amplify the constant-envelope signals 122A and 122B, respectively, and generate two amplified constant-envelope signals 124A and 124B. The first PA 104A and the second PA 104B may be placed sufficiently apart from each other and provided respective RF shields for minimization of inter-modulation or interference between the first PA 104A and the second PA 104B.

The first PA 104A and the second PA 104B, operating on the respective constant-envelope signals 122A and 122B, exhibit more power efficiency and lower back off than would a power amplifier utilized to amplify the modulated input signal 116 with variable amplitude. Further, the first PA 104A and the second PA 104B operating on the respective constant-envelope signals 122A and 122B, exhibit less non-linearity and introduce less distortion than would a power amplifier utilized to amplify the modulated input signal 116 with variable amplitude. The first PA 104A and the second PA 104B may feed the two amplified constant-envelope signals 124A and 124B to the power combiner 106.

The power combiner 106 may be configured to reconstruct an output RF signal 126 based on a combination of two amplified constant-envelope signals 124A and 124B, received from the first PA 104A and the second PA 104B. The combination may correspond to a sum (and a difference) of the two amplified constant-envelope signals 124A and 124B. In accordance with an embodiment, the combination of the two amplified constant-envelope signals 124A and 124B is expressed in equation (4) below:

$$S_{out}(t)=S'_1(t)+S'_2(t)$$

$$=G\cos(\Psi(t))\sin(\omega t+\varphi(t))$$

$$=GA(t)\sin(\omega t+\varphi(t)) \quad (4)$$

where $S_{out}(t)$ represents the output RF signal 126,
$S'_1(t)$ represents the first amplified constant-envelope signal 124A,
$S'_2(t)$ represents the second amplified constant-envelope signal 124B, and
G represents gain of the amplification stages, i.e. the first PA 104A and the second PA 104B.

Figure 2A:
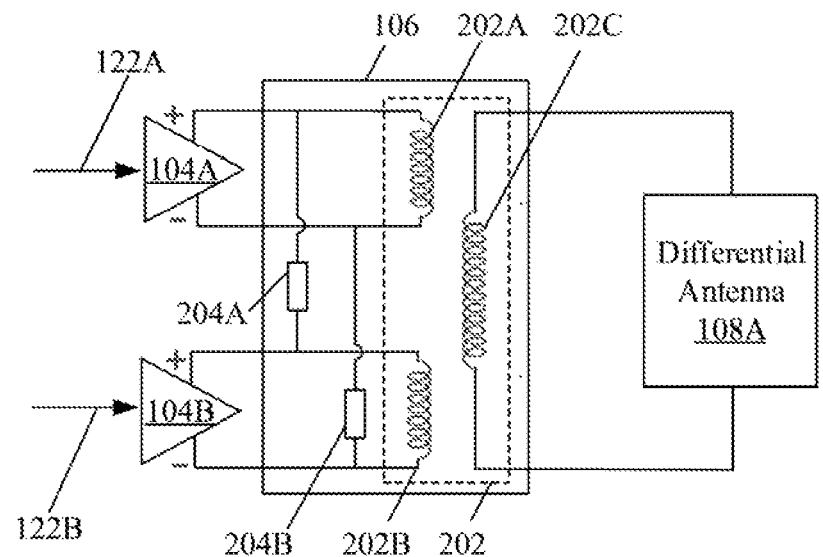
FIG. 2A illustrates a first exemplary embodiment of a low-loss isolating outphasing power combiner.

The power combiner 106 may be configured to match the impedances of the two PAs (i.e. the first PA 104A and the second PA 104B) and the Tx antenna 108. For such impedance matching, the power combiner 106 may utilize various components, such as load impedances and transformers. The primary coils in the transformers may be utilized to induce current in the secondary coils for certain currents, generated by two PAs based on the two amplified constant-envelope signals 124A and 124B. Further, the load impedances may be utilized to dissipate other currents, generated by the two PAs based on the two amplified constant-envelope signals 124A and 124B. Various embodiments of the power combiner 106 have been described in detail in FIGS. 2A to 2F. For example, in accordance with an embodiment as illustrated in FIG. 2A, the primary coils in the transformers may be utilized to induce current in the secondary coils for in-phase currents, generated by two PAs based on the two amplified constant-envelope signals 124A and 124B. In such a case, the load impedances may be utilized to dissipate out-phase currents, generated by two PAs based on the two amplified constant-envelope signals 124A and 124B. Accordingly, the voltage may be stabilized across the two PAs and the power efficiency of the outphasing RF Tx 100 may be enhanced.

Figure 2B:
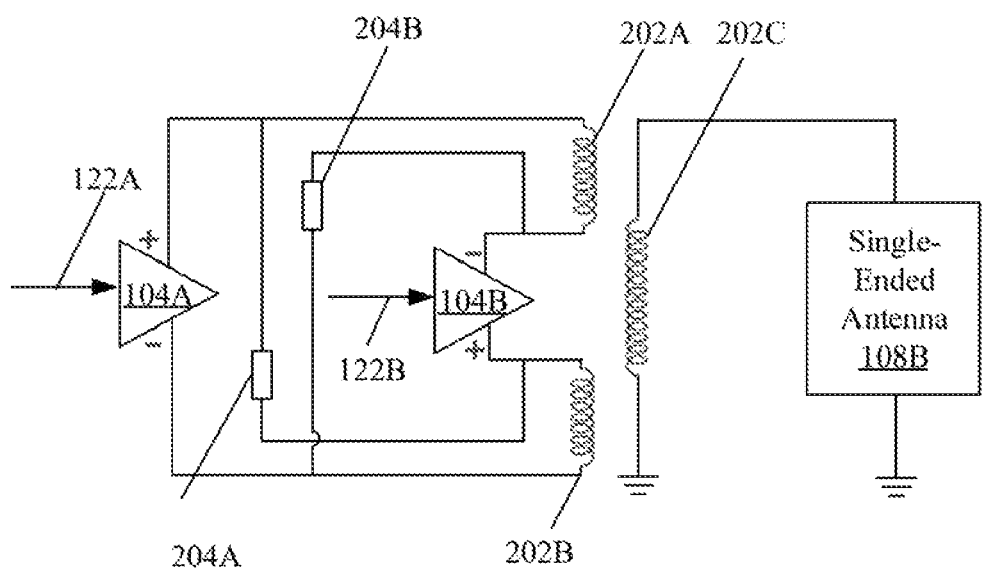
FIG. 2B illustrates a second exemplary embodiment of a low-loss isolating outphasing power combiner.
Figure 2C:
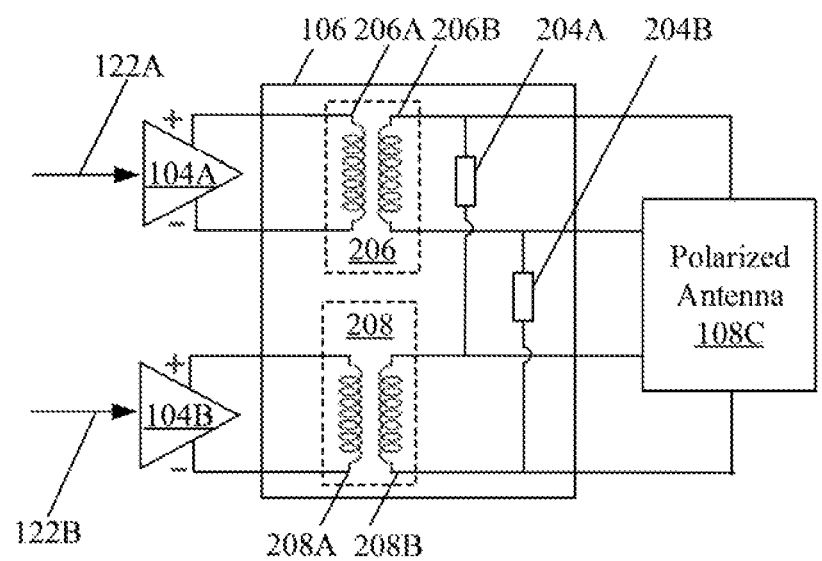
FIG. 2C illustrates a third exemplary embodiment of a low-loss isolating outphasing power combiner.
Figure 2D:
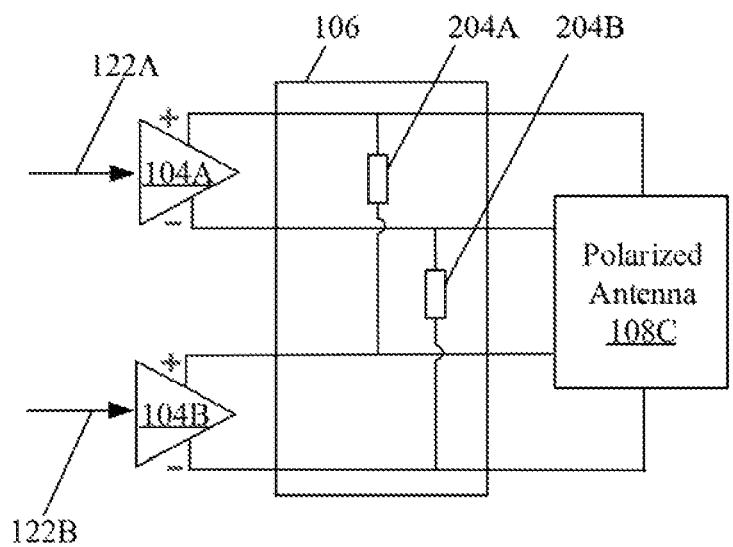
FIG. 2D illustrates a fourth exemplary embodiment of a low-loss isolating outphasing power combiner.

The power combiner 106 may feed the output RF signal 126 to the Tx antenna 108. In accordance with an embodiment, the Tx antenna 108 may be a differential antenna, as shown in FIG. 2A. In such a case, the differential antenna may receive the output RF signal 126, as expressed in the equation (4). In accordance with an embodiment, the Tx antenna 108 may be a single-ended antenna, as shown in FIG. 2B. In accordance with another embodiment, the Tx antenna 108 may be a polarized antenna, as shown in FIGS. 2C and 2D. In such a case, the polarized antenna (such as a dual-polarized patch antenna, a dual-polarized dipole antenna, or a dual-polarized slot antenna) may include a first pair of polarized ports (such as vertical ports) and a second pair of polarized ports (such as horizontal ports). One or more circuits in the polarized antenna may be configured to generate a first signal and a second signal based on the two amplified constant-envelope signals 124A and 124B. The first signal may correspond to a sum of the two amplified constant-envelope signals 124A and 124B, as expressed in the equation (4). The second signal may correspond to a difference of the two amplified constant-envelope signals 124A and 124B. The first pair of polarized ports and the second pair of polarized ports of the polarized antenna may be configured to transmit the first signal and the second signal to an outphasing RF receiver, via an RF communication network. Such an outphasing RF receiver may process the first and the second signal, received from the outphasing RF Tx 100, as described in FIG. 3.

FIG. 2A illustrates a first exemplary embodiment of a low-loss isolating outphasing power combiner. With reference to FIG. 2A, there is shown a portion of the outphasing RF Tx 100 that includes the first PA 104A, the second PA 104B, the power combiner 106, and a differential antenna 108A. The power combiner 106 may further include a transformer 202, a first load impedance 204A, and a second load impedance 204B. The transformer 202 may include a first primary coil 202A, a second primary coil 202B, and a secondary coil 202C.

The first primary coil 202A is coupled to the first PA 104A and the second primary coil 202B is coupled to the second PA 104B. The secondary coil 202C is coupled with the first primary coil 202A and the second primary coil 202B on one side, and with the differential antenna 108A on the other side. The first load impedance 204A is adjustable and coupled between first terminals of the first PA 104A and the second PA 104B. Similarly, the second load impedance 204B is adjustable and coupled between second terminals of the first PA 104A and the second PA 104B. It may be noted that in a first implementation of the first exemplary embodiment, as shown in FIG. 2A, the first terminals correspond to the positive terminals of the first PA 104A and the second PA 104B, and the second terminals correspond to the negative terminals of the first PA 104A and the second PA 104B. In a second implementation of the first exemplary embodiment, the first terminals correspond to the positive terminal of the first PA 104A and the negative terminal of the second PA 104B, and the second terminals correspond to the negative terminal of the first PA 104A and the positive terminal of the second PA 104B.

With reference to FIG. 2A, in accordance with the first implementation of the first exemplary embodiment, the first PA 104A receives the first constant-envelope signal 122A and generates the amplified first constant-envelope signal 124A. Similarly, the second PA 104B receives the second constant-envelope signal 122B and generates the amplified second constant-envelope signal 124B. Due to the amplified first constant-envelope signal 124A, a first current $I_1$ is generated across the output terminals of the first PA 104A. Similarly, due to the amplified second constant-envelope signal 124B, a second current $I_2$ is generated across the output terminals of the second PA 104B.

In accordance with the first implementation of the first exemplary embodiment, the first current $I_1$ is in-phase with the second current $I_2$. In other words, a first phase of the amplified first constant-envelope signal 124A in the first primary coil 202A is in the same direction with respect to a second phase of the amplified second constant-envelope signal 124B in the second primary coil 202B. In such a case, a current $I_3$ may be induced in the secondary coil 202C of the transformer 202. The secondary coil 202C may supply the current $I_3$ to the differential antenna 108A. At the same time, there is zero potential drop across the first terminals of the first PA 104A and the second PA 104B and the second terminals of the first PA 104A and the second PA 104B. Thus, no current is dissipated in the first load impedance 204A and the second load impedance 204B.

In accordance with the second implementation of the first exemplary embodiment, as described above, the first terminals correspond to the positive terminal of the first PA 104A and the negative terminal of the second PA 104B. Further, the second terminals correspond to the negative terminal of the first PA 104A and the positive terminal of the second PA 104B. In such an implementation, the first current $I_1$ is out-phased with the second current $I_2$. In other words, a first phase of the amplified first constant-envelope signal 124A in the first primary coil 202A is in the opposite direction with respect to a second phase of the amplified second constant-envelope signal 124B in the second primary coil 202B. In such a case, no current may be induced in the secondary coil 202C of the transformer 202. Thus, the secondary coil 202C may not supply any current to the differential antenna 108A. At the same time (concurrently), there is a potential drop across the first terminals of the first PA 104A and the second PA 104B and the second terminals of the first PA 104A and the second PA 104B. Thus, the currents $I_1$ and $I_2$ are dissipated in the first load impedance 204A and the second load impedance 204B, respectively.

FIG. 2B illustrates a second exemplary embodiment of a low-loss isolating outphasing power combiner. With reference to FIG. 2B, there is shown a portion of the outphasing RF Tx 100 that includes the first PA 104A, the second PA 104B, the power combiner 106, and a single-ended antenna 108B with one end connected to the ground. The power combiner 106 may further include a transformer 202, a first load impedance 204A, and a second load impedance 204B. The transformer 202 may include a first primary coil 202A, a second primary coil 202B, and a secondary coil 202C.

The first primary coil 202A is coupled to positive terminals of the first PA 104A and the second PA 104B. The second primary coil 202B is coupled to negative terminals of the first PA 104A and the second PA 104B. One end of the secondary coil 202C is coupled to the first primary coil 202A, the second primary coil 202B, and the single-ended antenna 108B. Other end of the secondary coil 202C is grounded. The first load impedance 204A is coupled between first terminals of the first PA 104A and the second PA 104B. Similarly, the second load impedance 204B is coupled between second terminals of the first PA 104A and the second PA 104B. It may be noted that in the first implementation of the second exemplary embodiment, as shown in FIG. 2B, the first terminals correspond to the positive terminal of the first PA 104A and the positive terminal of the second PA 104B, and the second terminals correspond to the negative terminal of the first PA 104A and the negative terminal of the second PA 104B. In a second implementation of the second exemplary embodiment, the first terminals correspond to the positive terminal of the first PA 104A and the negative terminal of the second PA 104B, and the second terminals correspond to the negative terminal of the first PA 104A and the positive terminal of the second PA 104B.

With reference to FIG. 2B, in accordance with the first implementation of the second exemplary embodiment, the first PA 104A receives the first constant-envelope signal 122A and generates the amplified first constant-envelope signal 124A. Similarly, the second PA 104B receives the second constant-envelope signal 122B and generates the amplified second constant-envelope signal 124B. Due to the amplified first constant-envelope signal 124A, a first current $I_1$ is generated across the output terminals of the first PA 104A. Similarly, due to the amplified second constant-envelope signal 124B, a second current $I_2$ is generated across the output terminals of the second PA 104B.

In accordance with the first implementation of the second exemplary embodiment, there is no potential drop across the first terminals of the first PA 104A and the second PA 104B and the second terminals of the first PA 104A and the second PA 104B. Thus, current is not dissipated in the first load impedance 204A and the second load impedance 204B and consequently, the first current $I_1$ will flow through the first primary coil 202A and the second current $I_2$ (that is in-phase with the first current $I_1$) will flow through the second primary coil 202B. Thus, the third current $I_3$ is induced in the secondary coil 202C, and is supplied to the single-ended antenna 108B.

In accordance with the second implementation of the second exemplary embodiment, as described above, there is a potential drop across the first terminals of the first PA 104A and the second PA 104B and the second terminals of the first PA 104A and the second PA 104B. Thus, current is dissipated in the first load impedance 204A and the second load impedance 204B. Consequently, no current will flow through the first primary coil 202A and the second primary coil 202B. In such implementation, no current is induced in the secondary coil 202C and thus, no current is supplied to the single-ended antenna 108B.

FIG. 2C illustrates a third exemplary embodiment of a low-loss isolating outphasing power combiner. With reference to FIG. 2C, there is shown a portion of the outphasing RF Tx 100 that includes the first PA 104A, the second PA 104B, the power combiner 106, and a polarized antenna 108C. The power combiner 106 may further include a first transformer 206 and a second transformer 208. The first transformer 206 may include a primary coil 206A and a secondary coil 206B. Similarly, the second transformer 208 may include a primary coil 208A and a secondary coil 208B. The polarized antenna 108C includes a first pair of polarized ports and a second pair of polarized ports. The first pair of polarized ports is coupled with the secondary coil 206B of the first transformer 206. The second pair of polarized ports is coupled to the secondary coil 208B of the second transformer 208. There is further shown a first load impedance 204A and a second load impedance 204B. The first load impedance 204A is coupled to the first terminals of the secondary coil 206B and the secondary coil 208B. The second load impedance 204B is coupled to the second terminals of the secondary coil 206B and the secondary coil 208B. In accordance with a first implementation of the third exemplary embodiment, the first terminals correspond to the positive terminals of the secondary coil 206B and the secondary coil 208B. Further, the second terminals correspond to the negative terminals of the secondary coil 206B and the secondary coil 208B. In accordance with a second implementation of the third exemplary embodiment, the first terminals correspond to the positive terminal of the secondary coil 206B and the negative terminal of the secondary coil 208B. Further, the second terminals correspond to the negative terminal of the secondary coil 206B and the positive terminal of the secondary coil 208B.

With reference to FIG. 2C, in accordance with the first implementation of the third exemplary embodiment, the first PA 104A receives the first constant-envelope signal 122A and generates the amplified first constant-envelope signal 124A. Similarly, the second PA 104B receives the second constant-envelope signal 122B and generates the amplified second constant-envelope signal 124B. Due to the amplified first constant-envelope signal 124A, a first current $I_{P1}$ is generated across the output terminals of the first PA 104A. Similarly, due to the amplified second constant-envelope signal 124B, a second current $I_{P2}$ is generated across the output terminals of the second PA 104B.

In accordance with the first implementation of the third exemplary embodiment, the first current $I_{P1}$ in the primary coil 206A is in-phase with the second current $I_{P2}$ in the primary coil 208A. In other words, a first phase of the amplified first constant-envelope signal 124A in the primary coil 206A is in the same direction with respect to a second phase of the amplified second constant-envelope signal 124B in the primary coil 208A. In such a case, a current $I_{S1}$ may be induced in the secondary coil 206B of the first transformer 206 and a current $I_{S2}$ may be induced in the secondary coil 208B of the second transformer 208. Consequently, there are no potential drops across the first load impedance 204A and the second load impedance 204B. Thus, the currents $I_{S1}$ and $I_{S2}$ are not dissipated across the first load impedance 204A and the second load impedance 204B and the currents $I_{S1}$ and $I_{S2}$ are supplied to the polarized antenna 108C.

In accordance with the second implementation of the third exemplary embodiment, as described above, the first current $I_{P1}$ is outphased with the second current $I_{P2}$. In other words, a first phase of the amplified first constant-envelope signal 124A in the primary coil 206A is in the opposite direction with respect to a second phase of the amplified second constant-envelope signal 124B in the secondary coil 208B. In such a case, the current $I_{S1}$ may be induced in the secondary coil 206B of the first transformer 206 and a current $I_{S2}$ may be induced in the secondary coil 208B of the second transformer 208. Consequently, there are potential drops across the first load impedance 204A and the second load impedance 204B. Thus, the currents $I_{S1}$ and $I_{S2}$ are dissipated across the first load impedance 204A and the second load impedance 204B and the currents $I_{S1}$ and $I_{S2}$ are not be supplied to the polarized antenna 108C.

FIG. 2D illustrates a fourth exemplary embodiment of a low-loss isolating outphasing power combiner. With reference to FIG. 2D, there is shown a portion of the outphasing RF Tx 100 that includes the first PA 104A, the second PA 104B, the power combiner 106, and the polarized antenna 108C. The power combiner 106 may further include the first load impedance 204A and the second load impedance 204B. The polarized antenna 108C includes a first pair of polarized ports and a second pair of polarized ports. The first pair of polarized ports is coupled with the first PA 104A. The second pair of polarized ports is coupled to the second PA 104B.

The first load impedance 204A is coupled to the first terminals of the first PA 104A and the second PA 104B. The second load impedance 204B is coupled to the second terminals of the first PA 104A and the second PA 104B. In accordance with a first implementation of the fourth exemplary embodiment, the first terminals correspond to the positive terminals of the first PA 104A and the second PA 104B. Further, the second terminals correspond to the negative terminals of the first PA 104A and the second PA 104B. In accordance with a second implementation of the fourth exemplary embodiment, the first terminals correspond to the positive terminal of the first PA 104A and the negative terminal of the second PA 104B. Further, the second terminals correspond to the negative terminal of the first PA 104A and the positive terminal of the second PA 104B.

With reference to FIG. 2D, in accordance with the first implementation of the fourth exemplary embodiment, the first PA 104A receives the first constant-envelope signal 122A and generates the amplified first constant-envelope signal 124A. Similarly, the second PA 104B receives the second constant-envelope signal 122B and generates the amplified second constant-envelope signal 124B. Due to the amplified first constant-envelope signal 124A, a first current $I_1$ is generated across the output terminals of the first PA 104A. Similarly, due to the amplified second constant-envelope signal 124B, a second current I₂ is generated across the output terminals of the second PA 104B.

In accordance with the first implementation of the fourth exemplary embodiment, when currents I₁ and I₂ are in-phase, there are no potential drops across the first load impedance 204A and the second load impedance 204B. Thus, the currents I₁ and I₂ are not dissipated across the first load impedance 204A and the second load impedance 204B and the currents I₁ and I₂ are supplied to the polarized antenna 108C.

In accordance with the second implementation of the fourth exemplary embodiment, as described above, when currents I₁ and I₂ are outphased, there are potential drops across the first load impedance 204A and the second load impedance 204B. Thus, the currents I₁ and I₂ are dissipated across the first load impedance 204A and the second load impedance 204B and the currents I₁ and I₂ are not supplied to the polarized antenna 108C.

In accordance with the third exemplary embodiment, it may be noted that if the output impedance of the outphasing RF Tx is infinite, then matching may not be required. The currents I₁ and I₂ may be supplied to the Tx antenna 108 or the load impedances (i.e. the first load impedance 204A and the second load impedance 204B). It may be further noted that if the output impedance of the outphasing RF Tx is finite, then it is required that the impedances of the polarized antenna 108C and the loads, independently matches with the impedance of the outphasing RF Tx. In such a case, the third exemplary embodiment, as illustrated in FIG. 2C, is recommended. It may be further noted that if the output impedance of the outphasing RF Tx is zero, then nothing comes up.

Figure 2E:
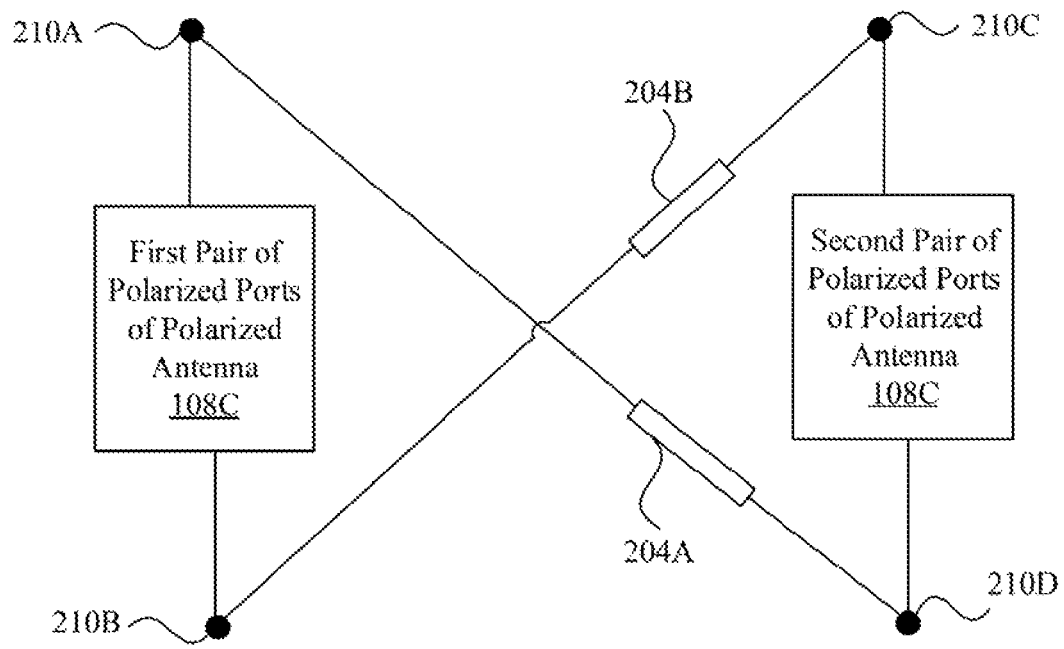
FIG. 2E illustrates a fifth exemplary embodiment of a low-loss isolating outphasing power combiner.

FIG. 2E illustrates a fifth exemplary embodiment of a low-loss isolating outphasing power combiner. With reference to FIG. 2E, there is shown a portion of the outphasing RF Tx 100 that includes four points 210A, 210B, 210C, and 210D. The first point 210A and the second point 210B represent the first constant-envelope signal 122A and the second constant-envelope signal 122B, respectively. The third point 210C and the fourth point 210D represent differentials of the first constant-envelope signal 122A and the second constant-envelope signal 122B, respectively. There are further shown a first pair of polarized ports of the polarized antenna 108C and a second pair of polarized ports of the polarized antenna 108C. The first pair of polarized ports of the polarized antenna 108C is coupled between the first point 210A and the second point 210B. The second pair of polarized ports of the polarized antenna 108C is coupled between the third point 210C and the fourth point 210D. Further the first load impedance 204A is coupled between the first point 210A and the fourth point 210D. The second load impedance 204B is coupled between the second point 210B and the third point 210C.

With reference to FIG. 2E, in accordance with the exemplary fifth exemplary embodiment, a current I enters at the first point 210A. In case the polarity of the second point 210B is identical to the polarity of first point 210A, and thus, the polarity of the fourth point 210D is opposite to the polarity of first point 210A, the current I is dissipated through the first load impedance 204A. In case the polarity of the second point 210B is opposite to the polarity of first point 210A, and thus, the polarity of the fourth point 210D is same as the polarity of first point 210A, the current I is supplied to the first pair of ports of the polarized antenna 108C. It may be noted that the first constant-envelope signal 122A and the second constant-envelope signal 122B are not completely independent of each other.

Figure 2F:
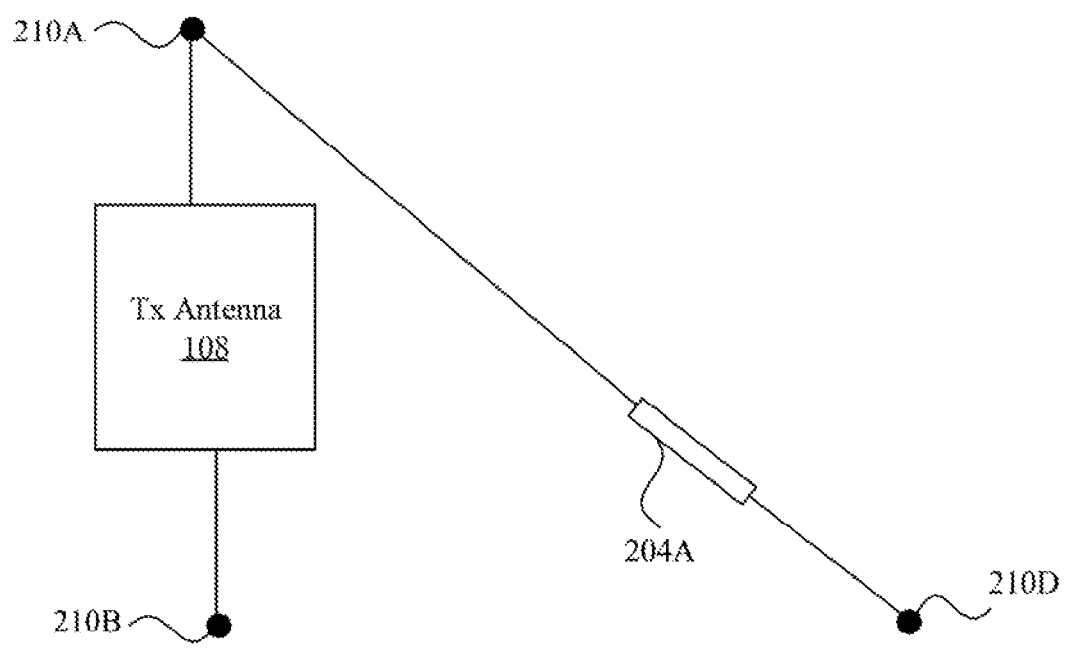
FIG. 2F illustrates a sixth exemplary embodiment of a low-loss isolating outphasing power combiner.

FIG. 2F illustrates a sixth exemplary embodiment of a low-loss isolating outphasing power combiner. With reference to FIG. 2F, as a portion of the fifth exemplary embodiment illustrated in FIG. 2E, there is shown a portion of the outphasing RF Tx 100 that includes three points 210A, 210B, and 210D. The first point 210A and the second point 210B represent the first constant-envelope signal 122A and the second constant-envelope signal 122B, respectively. The fourth point 210D represents differentials of the second constant-envelope signal 122B. There is further shown the polarized antenna 108. The polarized antenna 108 is coupled between the first point 210A and the second point 210B. Further the first load impedance 204A is coupled between the first point 210A and the fourth point 210D.

With reference to FIG. 2F, in accordance with the exemplary sixth exemplary embodiment, current I enters at the first point 210A. In case the polarity of the second point 210B is identical to the polarity of first point 210A, and thus, the polarity of the fourth point 210D is opposite to the polarity of first point 210A, the current I is dissipated through the first load impedance 204A. In case the polarity of the second point 210B is opposite to the polarity of first point 210A, and thus, the polarity of the fourth point 210D is same as the polarity of first point 210A, the current I is supplied to the Tx antenna 108.

Figure 3:
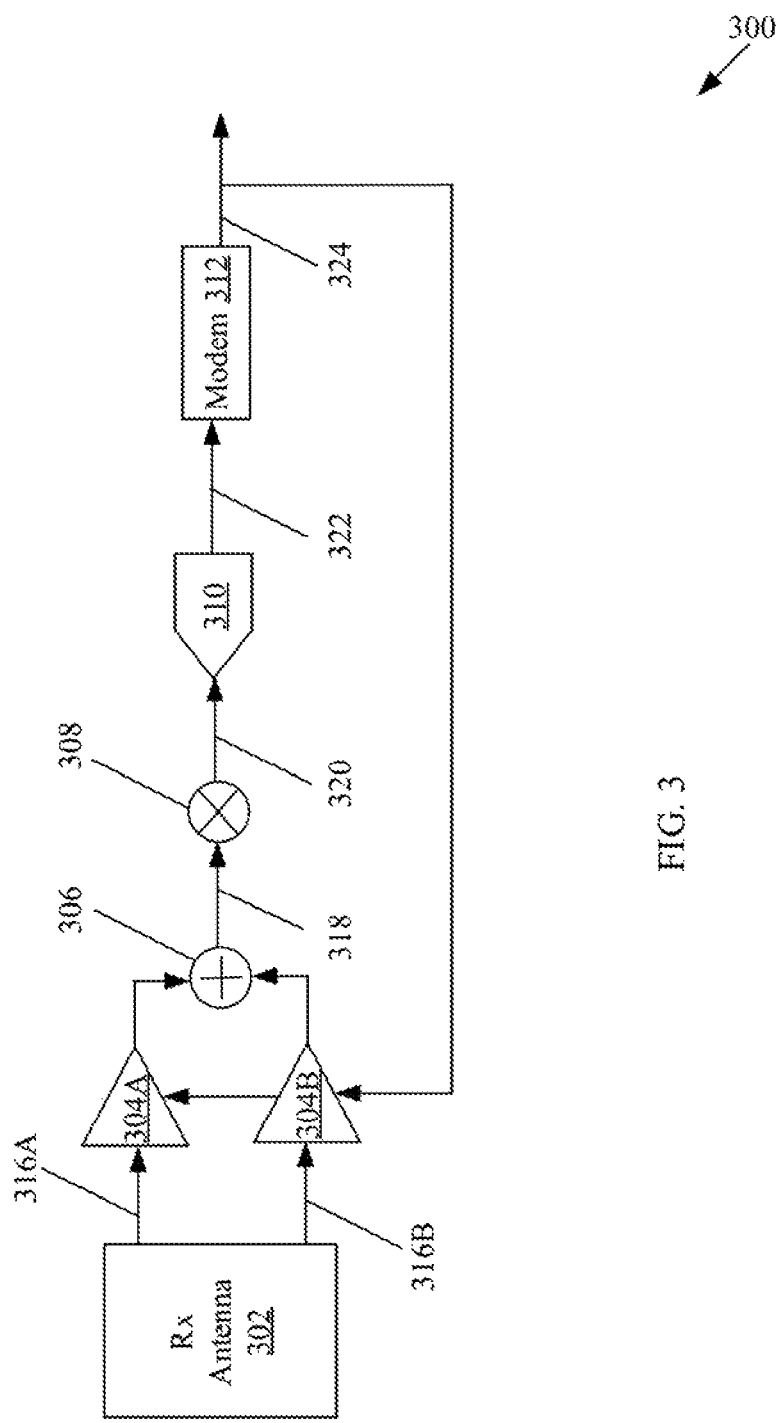
FIG. 3 illustrates an exemplary wireless system diagram of a portion of an exemplary outphasing RF receiver, in accordance with an exemplary embodiment of the disclosure.

FIG. 3 illustrates an exemplary wireless system diagram of a portion of an exemplary outphasing RF receiver (Rx). With reference to FIG. 3, there is shown an outphasing RF Rx 300 that includes an Rx antenna 302, a first variable-gain amplifier (VGA) 304A, a second VGA 304B, an Rx combiner 306, an Rx mixer 308, an analog-to-digital converter (ADC) 310, and a modem 312. The Rx antenna 302, in case of a differential antenna, may be directly coupled to the RX mixer 308. However, in case of a polarized antenna, it may be coupled to one or more VGAs, such as the first VGA 304A and the second VGA 304B. The first VGA 304A and the second VGA 304B may be coupled to the Rx combiner 306. The Rx combiner 306 may be further coupled to Rx mixer 308. The Rx mixer 308 may be coupled to the ADC 310, and the ADC 310, in turn in coupled to the modem 312.

In accordance with an embodiment, the Rx antenna 302 (which is a differential antenna) may be configured to receive the output RF signal 126, transmitted by the Tx antenna 108. In accordance with another embodiment, a first pair of polarized ports and a second pair of polarized ports of the Rx antenna 302 (which is a polarized antenna) may be configured to receive the respective first signal and the second signal, transmitted by the first pair of polarized ports and the second pair of polarized ports of the Tx antenna 108, via the RF communication network. More specifically, the first pair of polarized ports of the Rx antenna 302 may be configured to receive the first signal that corresponds to the sum of the two amplified constant-envelope signals 124A and 124B. The second pair of polarized ports of the Rx antenna 302 may be configured to receive the second signal that corresponds to the difference of the two amplified constant-envelope signals 124A and 124B.

Accordingly, one or more circuits in the Rx antenna 302 may be configured to extract a scaled version of the first amplified constant-envelope signal 316A based on the summation of the first signal and the second signal. The one or more circuits in the Rx antenna 302 may be further configured to extract a scaled version of the second amplified constant-envelope signal 316B based on the difference of the first signal and the second signal. In accordance with an embodiment, the scaled version of the first amplified constant-envelope signal 316A and the scaled version of the second amplified constant-envelope signal 316B are expressed in equations (5) and (6) below:

$$S''_1(t) = G_1 * S'_1(t) \quad (5)$$

$$S''_2(t) = G_2 * S'_2(t) \quad (6)$$

where $G_1$ represents gain of the first amplified constant-envelope signal 124A at the outphasing RF Rx 300,
$G_2$ represents gain of the second amplified constant-envelope signal 124B at the outphasing RF Rx 300,
$S''_1(t)$ represents the scaled version of the first amplified constant-envelope signal 316A,
$S''_2(t)$ represents the scaled version of the second amplified constant-envelope signal 316B,
$S'_1(t)$ represents the first amplified constant-envelope signal 124A, and
$S'_2(t)$ represents the second amplified constant-envelope signal 124B.

The Rx antenna 302 may feed the extracted scaled versions of the two amplified constant-envelope signals 316A and 316B to the Rx combiner 306, through the one or more VGAs. The Rx combiner 306 may be configured to combine the scaled versions of the two amplified constant-envelope signals 316A and 316B to generate a scaled version of amplified variable-envelope RF signal 318. The scaled version of the amplified variable-envelope RF signal 318 may be expressed in equation (7) below:

$$G * S_{com}(t) \quad (7)$$

where $S_{com}(t)$ represents the scaled version of the amplified variable-envelope RF signal 318.

It may be noted that the scaled version of the amplified variable-envelope RF signal 318 is a scaled RF version of the original modulated input signal 116. The Rx combiner 306 may feed the scaled version of the amplified variable-envelope RF signal 318 to the Rx mixer 308. The Rx mixer 308 may be configured to downconvert the scaled version of the amplified variable-envelope RF signal 318 into a scaled variable-envelope composite analog signal 320. The RX mixer 308 may feed the scaled variable-envelope composite analog signal 320 to the ADC 310.

The ADC 310 may be configured to convert the scaled variable-envelope composite analog signal 320 into scaled variable-envelope composite digital signal 322. The ADC 310 may feed the scaled variable-envelope composite digital signal 322 to the modem 312. The modem 312 may be configured to generate an output digital signal 324 based on the scaled variable-envelope composite digital signal 322.

In accordance with an embodiment, the modem 312 may be coupled to the one or more VGAs via a feedback line (not shown). As the scaled versions of the two amplified constant-envelope signals 316A and 316B use different paths, an imbalance may be observed in both gain and phase of the RF signals. This may result in an increased bit error rate (BER) for the output digital signal 324 at the outphasing RF Rx 300. In order to compensate for such imbalance, the outphasing RF Rx 300 may apply gain and phase adjustment to the scaled versions of the two amplified constant-envelope signals 316A and 316B by use of the feedback line. The feedback line may use the BER as feedback to adjust the gain of the one or more VGAs to compensate for gain imbalance and decrease the BER for the output digital signal 324.

In accordance with an embodiment, the planes of the first pair and the second pair of the polarized ports of the Tx antenna 108 in the outphasing RF Tx are parallel to the planes of the first pair and the second pair of polarized ports of the Rx antenna 302 in the outphasing RF Rx 300. In such a case, a signal power on the first pair and the second pair of the polarized ports of the Tx antenna 108 in the outphasing RF Tx is same as a signal power on the first pair and the second pair of polarized ports of the Rx antenna 302 in the outphasing RF Rx 300.

In accordance with an embodiment, the planes of the first pair and the second pair of polarized ports of the Tx antenna 108 in the outphasing RF Tx are at a defined angle with respect to the planes of the first pair and the second pair of polarized ports of Rx antenna 302 in the outphasing RF Rx 300. In such a case, a signal power on the first pair and the second pair of polarized ports of the Tx antenna 108 is different from a signal power on the first pair and the second pair of polarized ports of the Rx antenna 302. Accordingly, the outphasing RF Tx may be configured to modify a polarization ratio of the first pair and the second pair of the polarized ports of the Tx antenna 108.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to a central processing unit ("CPU" or processor), microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory any other non-transitory medium including digital, optical, analogue-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system described herein may be included in a semiconductor intellectual property core, such as a microprocessor core (e.g., embodied in HDL) and transformed to hardware in the production of integrated circuits. Additionally, the system described herein may be embodied as a combination of hardware and software. Thus, the present disclosure should not be limited by any of the above-described exemplary embodiments, but should be defined only in accordance with the following claims and their equivalents.

What is claimed is:
1. A power combiner circuit comprising:
   a transformer that includes a first primary coil, a second primary coil, and a secondary coil, wherein the first primary coil is coupled to a first power amplifier (PA) and the second primary coil is coupled to a second PA, and wherein the secondary coil is configured to supply a current to an antenna based on a first direction of a first phase of a first amplified constant-envelope signal in the first primary coil with respect to a second phase of a second amplified constant-envelope signal in the second primary coil; and a first load impedance associated with the first PA and a second load impedance associated with the second PA,
wherein the first load impedance and the second load impedance are configured to receive currents from the first PA and the second PA respectively, based on a second direction of the first phase of the first amplified constant-envelope signal with respect to the second phase of the second amplified constant-envelope signal.

2. The power combiner circuit of claim 1, wherein the first primary coil and the second primary coil of the transformer are coupled in parallel to the secondary coil of the transformer.

3. The power combiner circuit of claim 1,
wherein the first amplified constant-envelope signal is generated by the first PA based on a first constant-envelope signal,
wherein the second amplified constant-envelope signal is generated by the second PA based on a second constant-envelope signal, and
wherein the first constant-envelope signal and the second constant-envelope signal are received by the first PA and the second PA, respectively, from a signal decomposition block.

4. The power combiner circuit of claim 3, wherein the first constant-envelope signal and the second constant-envelope signal are generated by the signal decomposition block based on an outphasing of a modulated input signal.

5. The power combiner circuit of claim 4,
wherein the modulated input signal corresponds to an arbitrary signal with variable amplitude,
wherein the first constant-envelope signal and the second constant-envelope signal correspond to constant amplitude decomposed RF signals with phases in opposite direction, and
wherein the antenna corresponds to a differential antenna or a single-ended antenna.

6. The power combiner circuit of claim 1,
wherein the first load impedance is coupled between first terminals of the first PA and the second PA,
wherein the second load impedance is coupled between second terminals of the first PA and the second PA, and
wherein the first load impedance and the second load impedance are adjustable.

7. A power combiner circuit comprising:
a first transformer and a second transformer,
wherein a primary coil of the first transformer is coupled to a first power amplifier (PA) and a primary coil of the second transformer is coupled to a second PA, and
wherein a secondary coil of the first transformer and a secondary coil of the second transformer are configured to supply differential currents to a polarized antenna based on a first direction of a first phase of a first amplified constant-envelope signal in the primary coil of the first transformer with respect to a second phase of a second amplified constant-envelope signal in the primary coil of the first transformer; and a first load impedance associated with the first PA and a second load impedance associated with the second PA,
wherein the first load impedance and the second load impedance are configured to receive currents from the first PA and the second PA respectively, based on a second direction of the first phase of the first amplified constant-envelope signal with respect to the second phase of the second amplified constant-envelope signal.

8. The power combiner circuit of claim 7, wherein the polarized antenna comprises a first pair of polarized ports and a second pair of polarized ports.

9. The power combiner circuit of claim 8,
wherein the first pair of polarized ports of the polarized antenna is coupled with the first PA, and
wherein the second pair of polarized ports of the polarized antenna is coupled with the second PA.

10. The power combiner circuit of claim 8,
wherein the first pair of polarized ports of the polarized antenna is coupled with the secondary coil of the first transformer, and the second pair of polarized ports of the polarized antenna is coupled with the secondary coil of the second transformer based on decoupling of the first transformer and the second transformer in the power combiner circuit.

11. An outphasing radio frequency (RF) transmitter comprising:
a first power amplifier (PA) and a second PA,
wherein the first PA is configured to generate a first amplified RF signal based on a received first constant-envelope signal, and
wherein the second PA is configured to generate a second amplified RF signal based on a received second constant-envelope signal;
a power combiner configured to combine the generated first amplified RF signal and the second amplified RF signal, the power combiner comprising:
a transformer that includes a first primary coil, a second primary coil, and a secondary coil,
wherein the first primary coil is coupled to the first PA and the second primary coil is coupled to the second PA, and
wherein the secondary coil is configured to supply a current to an antenna based on a first direction of a first phase of a first amplified constant-envelope signal in the first primary coil with respect to a second phase of a second amplified constant-envelope signal in the second primary coil; and
a first load impedance associated with the first PA and a second load impedance associated with the second PA,
wherein the first load impedance and the second load impedance are configured to receive currents from the first PA and the second PA respectively, based on a second direction of the first phase of the first amplified constant-envelope signal with respect to the second phase of the second amplified constant-envelope signal; and
the antenna configured to transmit the transmit an output RF signal to an outphasing RF receiver, wherein the transmitted output RF signal corresponds to a combination of the generated first amplified RF signal and the second amplified RF signal.

12. The outphasing RF transmitter of claim 11, further comprising a signal decomposition block configured to decompose a modulated input signal into the first constant-envelope signal and the second constant-envelope signal.

13. The outphasing RF transmitter of claim 12,
wherein the modulated input signal corresponds to a variable amplitude modulated signal, and
wherein each of the first constant-envelope signal and the second constant-envelope signal correspond to a constant amplitude decomposed RF signal with different phases in opposite directions.

14. The outphasing RF transmitter of claim 11, wherein the antenna corresponds to at least one of a differential antenna or a single-ended antenna.

15. An outphasing radio frequency (RF) transmitter comprising:
a first power amplifier (PA) and a second PA,
wherein the first PA is configured to generate a first amplified RF signal based on a received first constant-envelope signal, and
wherein the second PA is configured to generate a second amplified RF signal based on a received second constant-envelope signal;
a power combiner configured to combine the generated first amplified RF signal and the second amplified RF signal, the power combiner comprising:
a first transformer and a second transformer,
wherein a primary coil of the first transformer is coupled to the first PA and a primary coil of the second transformer is coupled to the second PA, and
wherein a secondary coil of the first transformer and a secondary coil of the second transformer are configured to supply differential currents to an antenna based on a first direction of a first phase of a first amplified constant-envelope signal in the primary coil of the first transformer with respect to a second phase of a second amplified constant-envelope signal in the primary coil of the first transformer; and
a first load impedance associated with the first PA and a second load impedance associated with the second PA,
wherein the first load impedance and the second load impedance are configured to receive currents from the first PA and the second PA respectively, based on a second direction of the first phase of the first amplified constant-envelope signal with respect to the second phase of the second amplified constant-envelope signal; and
the antenna configured to transmit an output RF signal to an outphasing RF receiver, wherein the transmitted output RF signal corresponds to a combination of the generated first amplified RF signal and the second amplified RF signal.

16. The outphasing RF transmitter of claim 15,
wherein the antenna corresponds to a polarized antenna, and
wherein the polarized antenna comprises a first pair of polarized ports and a second pair of polarized ports.

17. The outphasing RF transmitter of claim 16,
wherein the first pair of polarized ports of the antenna is configured to transmit a first signal,
wherein the first signal corresponds to summation of the first amplified RF signal and the second amplified RF signal,
wherein the second pair of polarized ports of the antenna is configured to transmit a second signal, and
wherein the second signal corresponds to a difference of the first amplified RF signal and the second amplified RF signal.

18. The outphasing RF transmitter of claim 17,
wherein the first amplified RF signal may be extracted by the outphasing RF receiver based on summation of the first signal received at a first pair of polarized ports of a receiver antenna and the second signal received at a second pair of polarized ports of the receiver antenna from the outphasing RF transmitter.

19. The outphasing RF transmitter of claim 17, wherein the second amplified RF signal may be extracted by the outphasing RF receiver based on difference of the first signal received at a first pair of polarized ports of a receiver antenna and the second signal received at a second pair of polarized ports of the receiver antenna from the outphasing RF transmitter.

20. The outphasing RF transmitter of claim 15,
wherein planes of polarized ports of the antenna in the outphasing RF transmitter are parallel to planes of polarized ports of another antenna in the outphasing RF receiver, and
wherein a signal power on the polarized ports of the antenna in the outphasing RF transmitter is same as a signal power on the polarized ports of the other antenna in the outphasing RF receiver.

21. The outphasing RF transmitter of claim 15,
wherein planes of polarized ports of the antenna in the outphasing RF transmitter are at a defined angle with respect to planes of polarized ports of another antenna in the outphasing RF receiver,
wherein a signal power on the polarized ports of the antenna in the outphasing RF transmitter is different from a signal power on the polarized ports of the other antenna in the outphasing RF receiver, and
wherein the outphasing RF transmitter may be further configured to modify a polarization ratio of the polarized ports of the antenna in the outphasing RF transmitter.

* * * * *